US005305342A

United States Patent [19]
Ota

[11] Patent Number: 5,305,342
[45] Date of Patent: Apr. 19, 1994

[54] MULTIBEAM SEMICONDUCTOR LASER ARRAY

[75] Inventor: Takeshi Ota, Kanagawa, Japan

[73] Assignee: Fuji Xerox Co., Ltd., Tokyo, Japan

[21] Appl. No.: 904,025

[22] Filed: Jun. 25, 1992

[30] Foreign Application Priority Data

Jun. 28, 1991 [JP] Japan ................... 3-185240
Apr. 30, 1992 [JP] Japan ................... 4-137694

[51] Int. Cl.$^5$ ................................ H01S 3/19
[52] U.S. Cl. ......................... 372/50; 372/48; 372/49
[58] Field of Search .................... 372/50, 48, 49

[56] References Cited

U.S. PATENT DOCUMENTS 4,747,109  5/1988  Taneya et al. .............. 372/50
4,977,570 12/1990  Hasegawa ................... 372/50

FOREIGN PATENT DOCUMENTS 59-47873  3/1984  Japan .
2-39583   2/1990  Japan .
2-237186  9/1990  Japan .

OTHER PUBLICATIONS

R. L. Thornton et al, "High power (2.1 W) 10-stripe AlGaAs laser arrays with Si disordered facet windows," Appl. Phys Lett. 49 (23), Dec. 8, 1986, pp. 1572-1574.

Robert L. Thornton et al, "Properties of closely spaced independently addressable lasers fabricated impurity-induced disordering," Appl. Phys. Lett. 56 (17), Apr. 23, 1990, pp. 1623-1625.

N. Shimada et al, "Improvement in Droop Characteristics of Visible Light Laser Diode," The Japan Society of Applied Physics (Abstract), 1987, p. 973.

Y. Bessho et al, "790 nm. High-Power Eight-Beam AlGaAs Semiconductor Laser," The Japan Society of Applied Physics (Abstract), 1991, p. 1030.

Setsuko Murata et al, "Experiments of improving 50-$\mu$m-spaced 8-beam laser diode array characteristics by adding a heat-pass-wire," The Japan Society of Applied Physics (Abstract) 1991, p. 1030.

*Primary Examiner*—Georgia Y. Epps
*Attorney, Agent, or Firm*—Finnegan, Henderson, Farabow, Garrett & Dunner

[57] ABSTRACT

Disclosed is a multibeam semiconductor laser array serving as a light source which is able to perform writing operations simultaneously by means of a plurality of laser beams. The multibeam semiconductor laser array includes a substrate; a plurality of semiconductor laser elements respectively provided on the substrate and drivable independently of one another; a fist window area disposed on a first end surface of a cavity forming the semiconductor laser elements, having a band cap wider than that of an active material layer of the semiconductor laser element, and not excitable electrically; a low reflectance coating applied to the first window area for reducing an optical reflectance; and a high reflectance coating disposed on a second end surface of the cavity forming the semiconductor laser elements for increasing the optical reflectance. According to the thus constructed multibeam semiconductor laser array, an optical cross talk can be eliminated, and a laser oscillation threshold value and a thermal cross talk can be minimized.

10 Claims, 9 Drawing Sheets

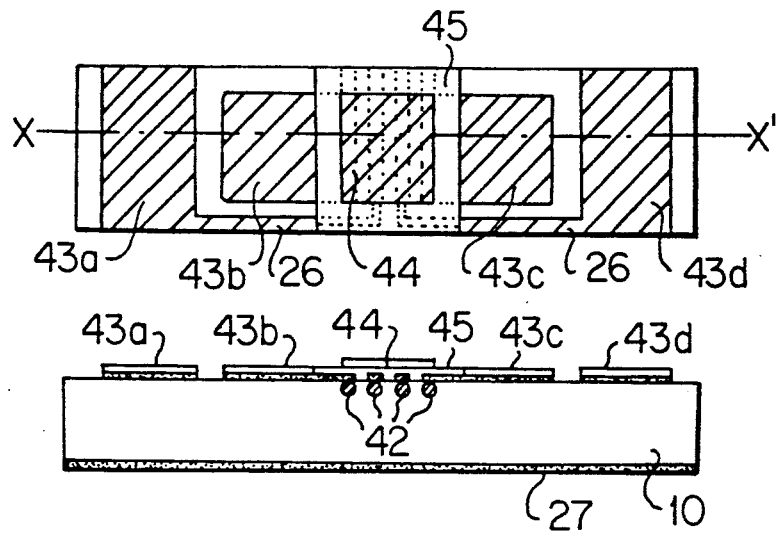
FIG. 13(a)
FIG. 13(b)
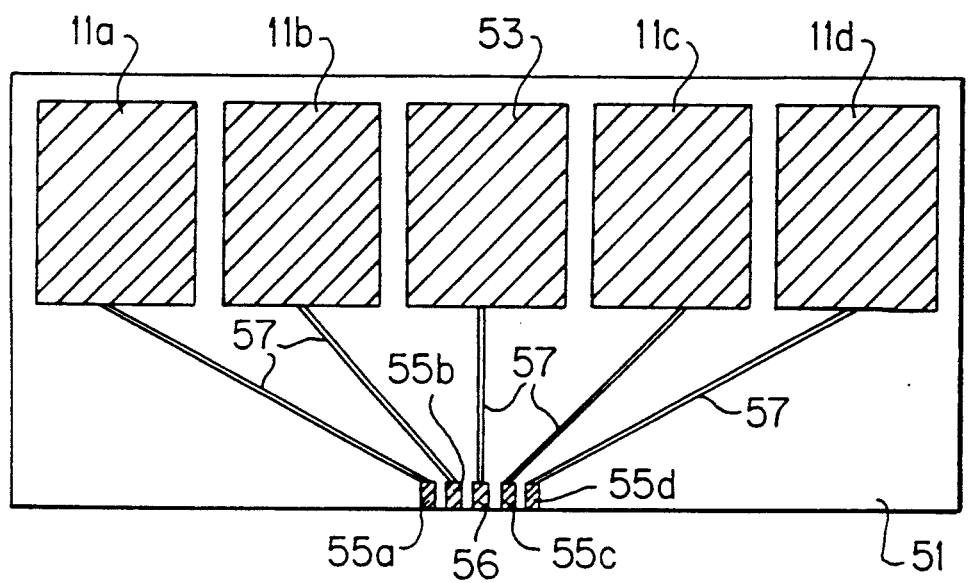
FIG. 14

MULTIBEAM SEMICONDUCTOR LASER ARRAY

BACKGROUND OF THE INVENTION

1. Field of the Invention

The present invention relates to a laser beam light source which is used for optical recording by means of a light beam in a digital copying machine, a laser beam printer, an optical disc system and the like and, in particular, to a multibeam semiconductor laser array serving as a light source which is applied for so-called multibeam optical recording.

2. Description of the Related Art

For example, in a laser beam printer, a laser beam from a semiconductor laser is irradiated onto a rotary polyhedral mirror referred to as a polygonal scanner, and the beam reflected from the rotary polyhedral mirror is then irradiated onto the surface of a photoreceptor which moves at a constant speed and is electrostatically charged. Due to the rotation of the rotary polyhedral mirror, the laser beam is scanned in a direction perpendicular to the moving direction of the photoreceptor. Since the laser beam is modulated according to an image to be output, an electrostatic latent image is formed on the photoreceptor. Then, the electrostatic latent image provides a visible toner image when it is developed.

In the laser beam printer of this type, in order to obtain finer resolution of the output image thereof, it is necessary to narrow a distance between scanning lines. Also, in order to output the image at a high speed, the scanning speed must be increased. The greatest problem in obtaining the finer resolution and higher process speed of the laser beam printer is that the rotation speed of polygonal scanner is limited.

In order to solve this problem, a multibeam scanning system in which a plurality of laser beams scan the object surface, is already proposed. It is also a matter of common knowledge that the multibeam scanning system is advantageous not only for application of the laser beam printer but also for improvement of the recording and reproducing speed of an optional disc. In the well known multibeam scanning system, a plurality of laser beam spots must be sufficiently near to one another in a direction (which is hereinafter referred to as a subsidiary scanning direction) perpendicular to a direction to be scanned by the polygonal scanner (which is hereinafter referred to as a main scanning direction). For this purpose, efforts have been made to manufacture a plurality of semiconductor lasers in such a manner that they are near to one another and, for the present, there has been manufactured by way of trial a semiconductor laser array in which semiconductor lasers are made near down to a distance of 10 μm (See Japanese Patent Unexamined Publication No. Hei. 2-39583, R. L. Thornton et. al, "Properties of closely spaced independently addressable lasers fabricated by impurity-induced disordering", Appl. Phys. Lett. 56(17), 1623–1625 (1990) and the like).

On the other hand, in an optical system employed in a laser beam printer using a semiconductor laser whether it uses multibeams or a single beam, it is the most difficult to maintain the accuracy of a collimator disposed on the light source side. The divergence angle of a laser beam light ray emitted from a semiconductor laser is $\theta_1 = 8°$ of FWHM (Full Width at Half Maximum) or so in a direction parallel to the junction and $\theta_2 = 32°$ or so in a direction perpendicular to the junction (Japanese Patent Unexamined Publication No. Hei. 2-39583). The collimator must be designed in accordance with the large angle, that is, $\theta_2$, and requires a collimator lens which has a high value of NA (Numerical Aperture) 0.5 or greater. It is difficult to produce a lens of low aberration from such a bright lens. Also, the depth of focus of such a bright lens of NA 0.5 is shallow, that is, on the order of 8 μm, which makes it difficult to maintain the accuracy of the optional system.

The divergence angle of the laser beam of the semiconductor laser depends on the structure of the semiconductor laser and, in view of such dependency, by employing such a structure as having, in the portion thereof in contact with the end surface of a cavity of the semiconductor laser, an area which is formed of a material having a wider band gap than the material of the active layer thereof and also which is not electrically excitable (which structure is hereafter referred to as a window structure), it is reported that the above-mentioned angle $\theta_2$ reduced down to about one-half, in particular, from 34° down to 19° (See Robert Thornton et. al., "High power (2.1 W) 10 stripe laser arrays with Si disordering facet windows", Appl. Phys. Lett., 49 (23), 1572–1574 (1986)) It is considered that such reduction of $\theta_2$ is caused by the fact that the laser beam in a window area is spread or diverged to thereby expand a near field pattern on the end surface of the semiconductor laser. If a single beam is used, by means of employment of the window structure, it is then possible to improve the above-mentioned problem that requires a bright collimator lens having NA (Numerical Aperture) of 0.5 or greater, resulting in the shallow depth of focus.

Also, it is well known that the above-mentioned window structure is also advantageous in increasing the output power of the laser beam from the semiconductor laser. The COD (Catastrophic Optical Degradation) level of end surface of semiconductor laser limits maximum power of laser beam. That is, the employment of the window structure can enhance the breaking strength and thus can improve the laser beam output. However, in order to improve the maximum output power by employing the window structure, the window structure must be provided in both of the two cavity end surfaces of the semiconductor laser. This is because, if the COD level of one cavity end surface is enhanced while the COD level of the other cavity end surface remains unchanged, then the breaking strength of the whole semiconductor laser is determined as the lower COD level. In the above-mentioned cured reference as well, it is reported that the maximum output power could be enhanced 4 times higher. It is known that, in an optical disc system, especially in a magnetic optical disc system, the maximum output power required for the laser beam must be large, for example, 100 mW. Therefore, it is considered effective to enhance the maximum output of the semiconductor laser by means of employment of the window structure.

Now, a thermal cross talk provides a problem in the multibeam semiconductor laser array, whether the multibeam semiconductor laser array is used in a laser beam printer or in an optical disc system. In order to improve such thermal cross talk, it is effective to mount the semiconductor laser array tip to a heat sink in a so-called junction-side-down manner. (See, for example, "790 nm High-Power Eight-Beam AlGaAs Semiconductor Laser" written by Bessho et. al. and found in Extended Abstract (Autumn Meeting '91) of The Japan Society of Applied Physics, 11p-ZM-17 (1991), or "Experiments of improving 50-μm-spaced 8 beam laser diode array characteristics by adding a heat-pass-wire" written by Murata et al. and found in Extended Abstract (Autumn Meeting '91) of The Japan Society of Applied Physics, 11p-ZM-18 (1991)). The above term "junction-side-down" means that the junction side of the semiconductor laser is mounted to the heat sink.

To improve the thermal cross talk, it is also believed that increasing the reflectance of the end surface is effective. In particular, if the reflectance of the end surface of the semiconductor laser is increased, then the threshold current of the semiconductor laser is lowered and the characteristic temperature thereof is increased, with the result that the thermal cross talk is reduced. It is also reported that the Droop of a single semiconductor laser element could be reduced down to about 1/5 by increasing the reflectance of the end surface of the semiconductor laser (See "Improvement in Droop Characteristics of Visible Light Laser Diode" written by Shimada et al. and found in Extended Abstract (Autumn Meeting '91) of The Japan Society of Applied Physics, 9p-ZM-3(1991)). The term "Droop" means here a thermal influence on a semiconductor laser element itself when it generates heat. If a semiconductor laser element having a good Droop characteristic is used to provide an array, then it is expected that the thermal cross talk of such array can be reduced. In the above-mentioned paper, it is reported that the Droop could be reduced from 5% down to 1% by increasing by 35% to 50% in the reflectance of both end surfaces of the array. However, in this case, the COD level and slope efficiency may be lowered and, as a result of this, the maximum output power of the semiconductor laser is decreased.

From view of the above description, if the above window structure is employed in the multibeam semiconductor laser array, then the above-mentioned $\theta_2$ can be reduced and at the same time it is expected that the maximum output power can be increased. It is also considered that the reflectance of the end surface is increased to thereby the thermal cross talk and the decrease in the maximum output power produced as an adverse side effect during this is made up for by means of employment of the window structure.

However, when the above-mentioned window structure is employed in the multibeam semiconductor laser array, then there arises a problem, that is, an optical coupling to be discussed below, which makes it difficult to realize the multibeam semiconductor laser array employing the window structure. The multibeam semiconductor laser array employing the window structure has such a structure as shown in FIG. 15. In such structure, for example, a laser beam 1 emitted from a semiconductor laser element LD-1 is spread or diverged in a window area 2, and is then reflected by an end surface 3 which normally has an optical reflectance of the order of 35%, and part of the leaving ray goes into a semiconductor laser element LD-2 adjacent to the semiconductor laser element LD-1. This means that the two semiconductor laser elements LD-1 and LD-2 are optically coupled together, resulting in an optical cross talk between the two adjoining semiconductor laser elements LD-1 and LD-2. Further, it is considered that, in addition to the increased reflectance of the end surface, the employment of the window structure will worsen the optical coupling problem.

One of methods for decreasing the optical cross talk is to decrease the optical reflectance of the end surface in which the window area is provided. The employment of this method cannot provide an effect to reduce the thermal cross talk but can provide an effect to reduce $\theta_2$. However, even when only the reduction of $\theta_2$ is aimed at, if the optical reflectances of both of the end surfaces are reduced, then the quantity of the positive feedback of a laser oscillator is caused to decrease and the threshold current of the laser oscillation of the oscillator is increased and, in the worst case, there is a possibility that the laser oscillator may fail to function as a laser oscillator. As described above, if the window structure is employed so as to reduce $\theta_2$, then there arises a problem that the optical cross talk between the semiconductor laser elements is increased. Also, if the optical reflectance of the end surface including therein the window area is reduced so as to decrease the optical cross talk, then it arises a problem that the threshold current of the laser oscillation is increased. Further, when there is employed the method of reducing the optical reflectance of the end surface, then it cannot be expected an effect that the maximum output power of the laser beam can be enhanced due to employment of the window structure.

SUMMARY OF THE INVENTION

The present invention aims at eliminating the above-mentioned drawbacks found in the conventional multibeam semiconductor laser array.

Accordingly, it is an object of the invention to provide a multibeam semiconductor laser array which eliminates an optical cross talk, can minimize a laser oscillation threshold current and a thermal cross talk, and can provide a large maximum output power.

In order to attain the above object, the present invention provides a multibeam semiconductor laser array including a substrate; a plurality of semiconductor laser elements respectively provided on the substrate and drivable independently of one another; a fist window area disposed on a first end surface of a cavity forming the semiconductor laser elements, having a band cap wider than that of an active layer of the semiconductor laser element, and not excitable electrically; a low reflectance coating applied to the first window area for reducing an optical reflectance; and a high reflectance coating disposed on a second end surface of the cavity forming the semiconductor laser elements for increasing the optical reflectance.

BRIEF DESCRIPTION OF THE DRAWINGS

The exact nature of this invention, as well as other objects, features and advantages thereof, will be readily apparent from consideration of the following specification relating to the accompanying drawings, in which like reference characters designate the same or similar parts throughout the figures thereof and wherein:

FIGS. 13(a) and 13(b) are top plan and section views of a structure of a multibeam semiconductor laser array chip shown in FIG. 12;

FIG. 14 is a top plan view of a heat sink 51 shown in FIG. 12; and

DETAILED DESCRIPTION OF THE PREFERRED EMBODIMENTS

Detailed description will hereunder be given of the preferred embodiments of a multibeam semiconductor laser array according to the present invention with reference to the accompanying drawings

FIRST EMBODIMENT

Figure 1:
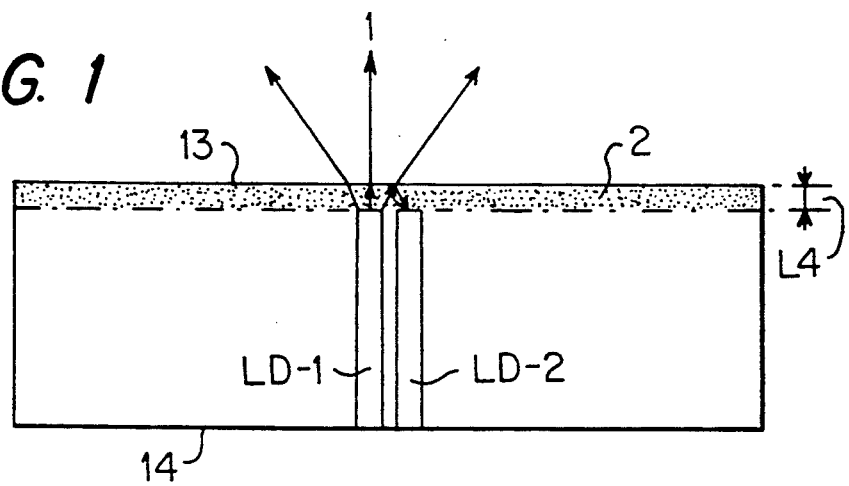
FIG. 1 is a plan view of an example of a light ray emitted from a first embodiment of a multibeam semiconductor laser array according to the invention.

Referring now to FIG. 1, it is shown a typical view of oscillation of a laser constructed according to a first embodiment of a multibeam semiconductor laser array according to the invention. The laser light ray from a laser LD-1 is little reflected on the end surface of the laser LD-1 because of presence of a layer 13 of optically low reflectance and, therefore, a little part of laser light ray can enter a laser LD-2. For this reason, an optical cross talk does not occur between the two lasers LD-1 an LD-2.

Description will be given below of the first embodiment of the invention with reference to FIGS. 2 to 4.

Figure 2:
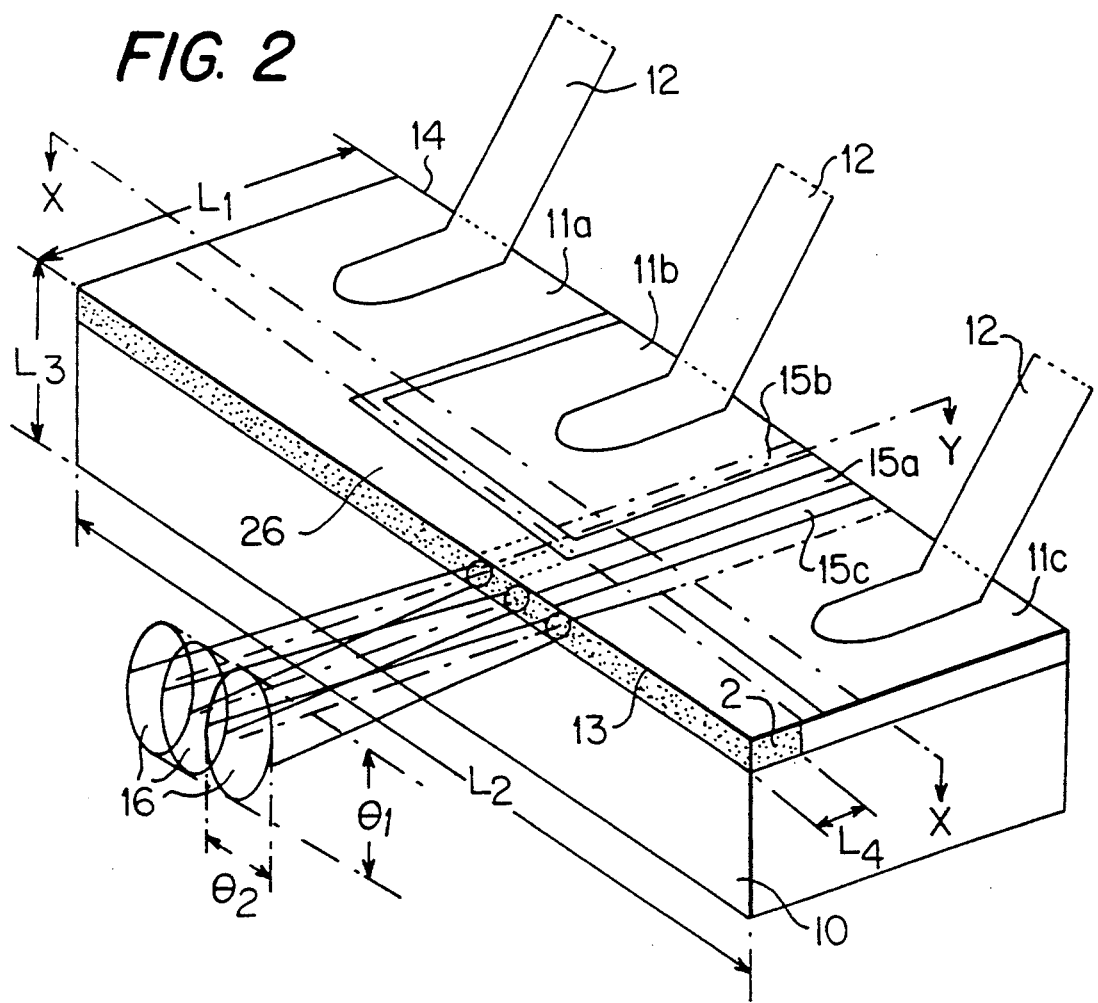
FIG. 2 is a perspective view of a structure of the first embodiment of the invention.
Figure 3:
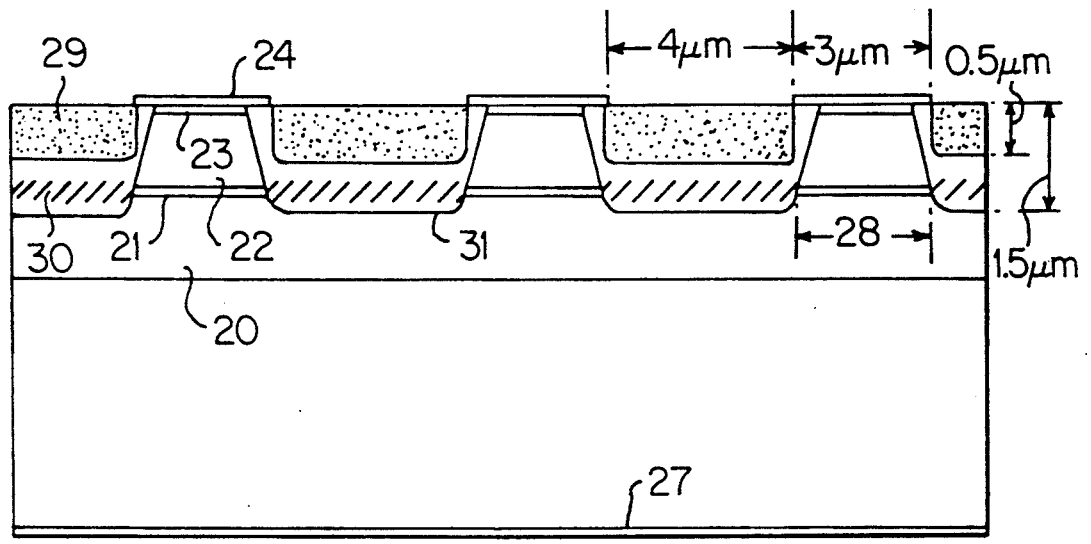
FIG. 3 is a section view taken along a straight line X in FIG. 2.
Figure 4:
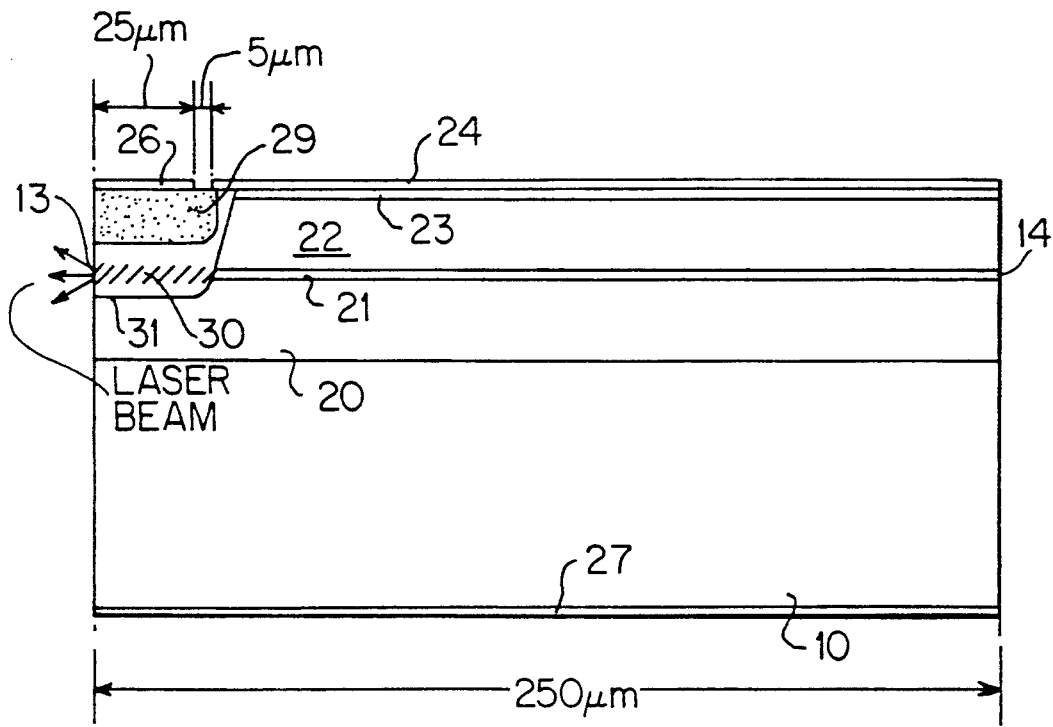
FIG. 4 is a section view taken along a straight line Y in FIG. 2.

FIG. 2 is a perspective view of a structure of the first embodiment of the invention, FIG. 3 is a section view of the semiconductor laser array taken along the line X—X in FIG. 2 and, FIG. 4 is a section view of the semiconductor laser array taken along the line Y—Y in FIG. 2.

The multibeam semiconductor laser array according to the first embodiment of the invention is constructed in such a manner that three semiconductor laser arrays 15a, 15b and 15c are arranged at a distance of 7.0 μm from one another on a single substrate 10. Each of the semiconductor laser elements 15 is formed in double hetero structure of AlGaAs system, in which impurity induced disordering is used to keep or confine lateral currents and light rays therein and also to form a window area 2. Each of the semiconductor laser elements 15 has a light emitting wave length of 0.78 μm and a stripe width of about 3 μm.

The substrate 10 is a silicon (Si) doped GaAs substrate. Both n-type clad layer 20 and p-type clad layer 22 of the semiconductor laser element are formed of $Al_{0.4}Ga_{0.6}As$ and have a thickness of 1.0 μm, and an active layer 21 of the semiconductor laser element is formed of $Al_{0.1}Ga_{0.9}As$ and has a thickness of 0.1 μm. The clad layer 20, which is disposed on the substrate side, is an n-type layer which is doped with Se. This clad layer 20 has a carrier density of $1.0 \times 10^{18}$ cm$^{-3}$. The clad layer 22, which is located on the upper side of the semiconductor laser element, is a p-type layer doped with Mg. This upper clad layer 22 has a carrier density of $1.0 \times 10^{18}$ cm$^{-3}$. The active layer 21 is interposed between the two clad layers. On the top portion of the upper p-type clad layer, there is provided a cap layer 23 for making an ohmic contact. The cap layer 23 is formed of GaAs with Mg doped therein and has a thickness of 0.1 μm. The carrier density of the cap layer 23 is $1.0 \times 10^{18}$ cm$^{-3}$. Referring to the element dimensions of the whole multibeam semiconductor laser array, the cavity length L1 thereof is 250 μm, the width L2 thereof is 800 μm and the thickness L3 thereof is 100 μm. On the upper surface of the laser array, there are provided three bonding pads 11a to 11c which are used to take out external electrodes, each of which pads is 200 μm × 200 μm in size. The bonding pad 11a corresponds to the semiconductor laser element 15a situated centrally in FIG. 2. The remaining bonding pads 11b and 11c correspond to the semiconductor laser elements 15b and 15c, respectively.

In order to connect the central semiconductor laser element 15a, among the three semiconductor laser elements, to the corresponding pad 11a, there is provided an electrode 26 on a window area, as shown in FIG. 4. The contact electrode 24, bonding pads 11a to 11c and connecting electrode 26 are respectively formed of a combination of gold zinc alloy (Au-Zn) easy to make an ohmic contact with the cap layer 23 with gold tin alloy (Au-Sn) piled on the gold zinc alloy (Au-Zn) easy to attach to the gold wire (Au) of a boning wire 12. In a portion which does not correspond to the stripe 28, there are proton bombarded area 29, down to the depth of about 0.5 μm of the upper p-type clad layer 22, preventing generation of a leak current.

As shown in FIG. 1, the window area 2 is disposed in one of the end surfaces of the laser element with a width L4=25 μm. On the end surface of the window area 2, there is provided a coating (which is hereinafter refereed to as a ¼ wave length coating), which is formed of alumina ($Al_2O_3$) and has a thickness corresponding to the wave length a quarter of the laser oscillation wave length. That is, this coating serves as a low reflectance coating 13 so that the optical reflectance can be reduced down to about 4%. The laser beam light ray is taken out from the end surface onto which the low reflectance coating 13 consisting of the ¼ wave length coating of alumina ($Al_2O_3$) is applied. On the opposite end surface, high reflectance multi-layer coating 14, which has a structure of three cycle of ($\frac{1}{4}\lambda - Si + \frac{1}{4}\lambda Al_2O_3$), thereby obtaining an optical reflectance of 98%, is formed.

The semiconductor laser element constructed in the above-mentioned manner is found to have an oscillation threshold current substantially equal to that of a conventional semiconductor laser element which does not include any window area and low reflectance coating. Further, according to the present semiconductor laser element, an optical cross talk caused by the reflection on the end surface on the window area side is reduced down to about one-tenth. Also, when a low optical reflectance is necessary, a low reflectance coating composed of a ¼ wave length coating formed of hafnium oxide (Hf$_2$O$_3$) instead of alumina (Al$_2$O$_3$) may be applied to thereby reduce the optical reflectance down to 0.1% or less. In the above-mentioned structure, the divergence angle $\theta_1$ of a laser light ray 16 in a direction parallel to the junction is of the order of 8° (Full Width at Half Maximum), and the divergence angle $\theta_2$ of the laser light ray in a direction perpendicular to the junction is of the order of 19° (Full Width at Half Maximum).

Figure 5A:
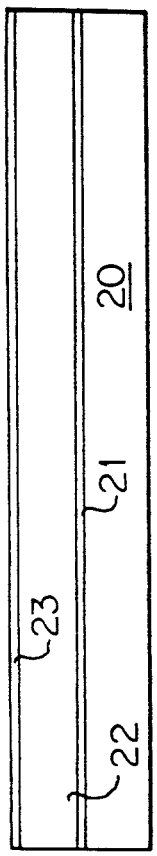
FIGS. 5(a) through 5(e) are sectional views to show a process in which the sectional structure shown in FIG. 3 is formed.
Figure 5B:
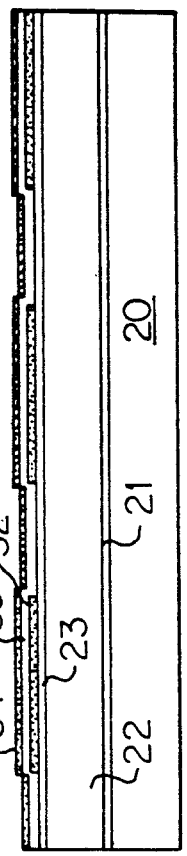
Figure 5C:
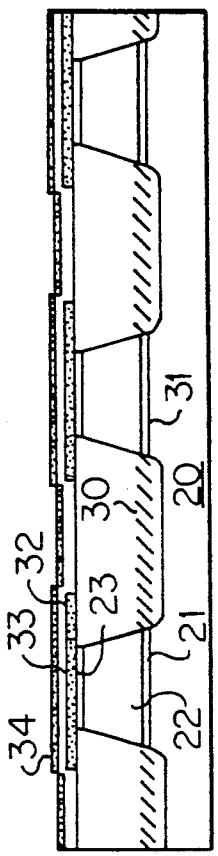
Figure 5D:
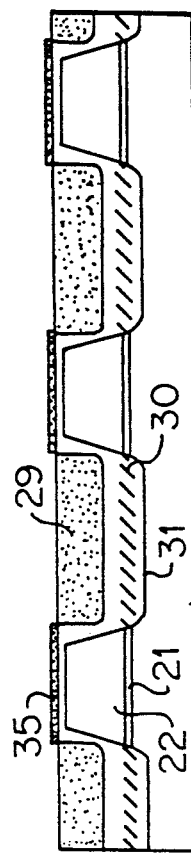

Next, description will be given below in brief of a method of manufacturing the multibeam semiconductor laser array according to the first embodiment of the invention with reference to FIGS. 5(a) through 5(e) and 6(a) through 6(f). FIGS. 5(a) through 5(e) are respectively sectional structure views to show a process in which the multibeam semiconductor laser array is formed. FIGS. 6(a) through 6(e) correspond to FIGS. 5(a) through 5(e) respectively. At first, as shown in FIG. 5(a), by means of MOCVD method, a Se doped GaAs buffer layer of 0.5 μm (not shown), n-type clad layer 20, active layer 21, p-type clad layer 22, and cap layer 23 are sequentially grown in an epitaxial manner on the silicone doped n-type GaAs substrate 10. Next, by means of a combination of CVD method with photolithography, a silicone diffusion source 33 is formed on the cap layer 23, as shown in FIG. 5(b). Then, by diffusing Si for several hours at a temperature of around 800° C. in a diffusion furnace, in a portion in which a diffusion block layer 32 is not present, silicon (Si) id diffused in the epitaxial layer and, in an area 31 in which Si is diffused, the two clad layers 20 and 22 and active layer 21 are intermixed to thereby form such a structure as shown in FIG. 5(c). This phenomenon is referred to as disordering due to diffusion of impurity, that is, impurity-induced disordering.

Since the mixed crystal area 30 is smaller in index of refraction in a wide gap when compared with the active layer 21, the area 30 is able to keep or confine lateral carriers and light rays therein and is also able to form the window area. Next, after a diffusion cap layer 40 (Si$_3$N$_4$) 34, diffusion source (Si) 33 and diffusion block layer (Si$_3$N$_4$) 32 are removed by means of dry etching, and after that photolithography is applied to thereby pattern a resist 35 in a portion corresponding to the stripe 28. Then, protons are bombarded there to thereby form the insulated area 29. In this manner, a structure shown in FIG. 5(e) can be obtained. Next, after removing the resist, the photolithography is used again to pattern a resist in the insulated area 29 and gold zinc alloy (Au-Zn) and gold tin alloy (Au-Sn) are attached by evaporation onto the patterned resist. Next, the resist is tuned to ashes to leave the evaporation coating in a portion where no resist is present, to thereby form the contact electrode 24 This process is a so-called lift-off method.

Figure 5E:
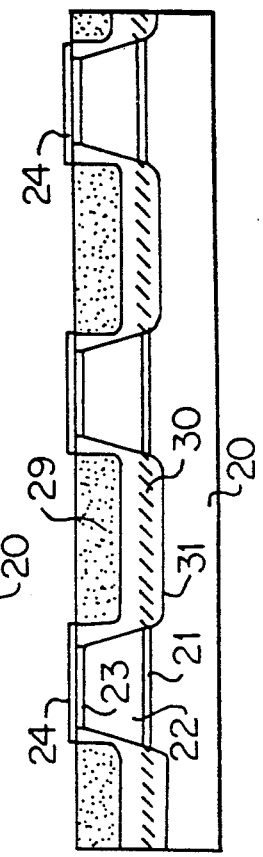
Figure 6A:
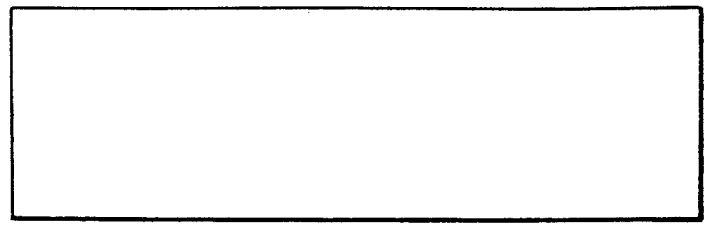
FIGS. 6(a) through 6(f) are top plan views corresponding to FIGS. 5(a) through 5(e)
Figure 6B:
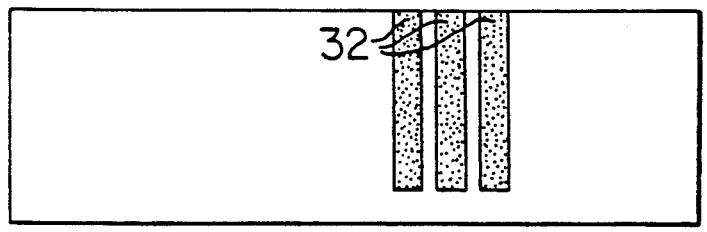
Figure 6C:
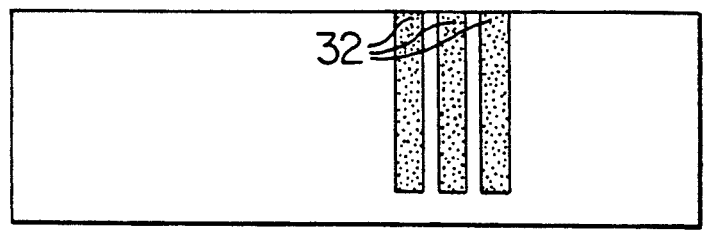
Figure 6D:
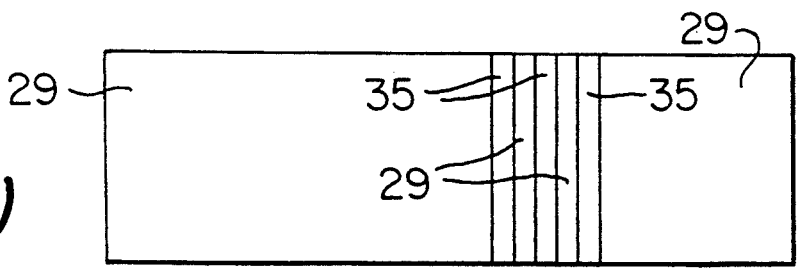
Figure 6E:
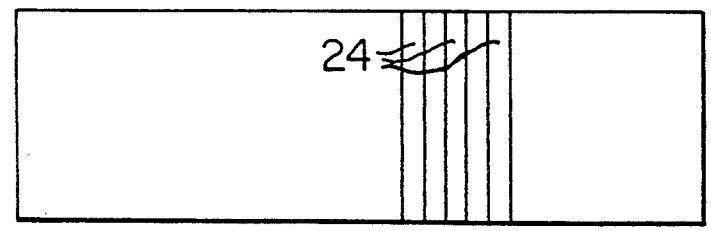
Figure 6F:
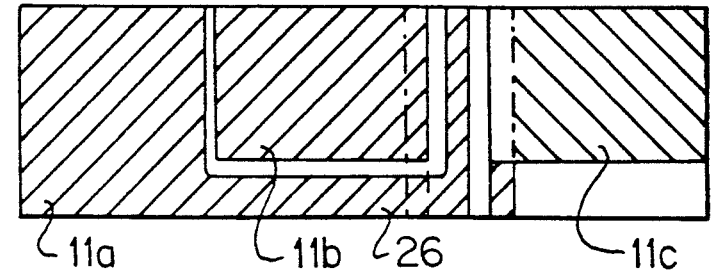

In this manner, structure shown in FIGS. 5(e) and 6(e) can be obtained. After that, the connection electrode 26 and bonding pads 11a to 11c are formed in a similar manner to the above-mentioned contact electrode 24, thereby providing a structure shown in FIG. 6(f). Further, after a back surface electrode (Au-Ge) 27 is attached by evaporation, the whole sample is thermally treated under a given condition to thereby form an ohmic contact. After that, a cleaving step, an end surface coating step, a die bonding step, and a wire bonding step are performed to thereby complete the multibeam semiconductor laser array. The end surface coating was carried out in two steps according to a vacuum evaporation method. A single-layer coating of alumina (Al$_2$O$_3$) was formed on the end surface that is situated on the window side, while alumina (Al$_2$O$_3$) and silicone (Si) were alternately evaporation coated for three cycles on the opposite end surface. By the way, in FIGS. 6(a) through 6(f), there is shown an outer peripheral portion in such a manner as if it were present. However, the outer peripheral portion is drawn to facilitate the understanding of the above-mentioned structure and, in fact such outer peripheral portion is not yet present in this stage. Such shape of the outer peripheral portion can be obtained after the cleaving step is carried out.

Figure 7:
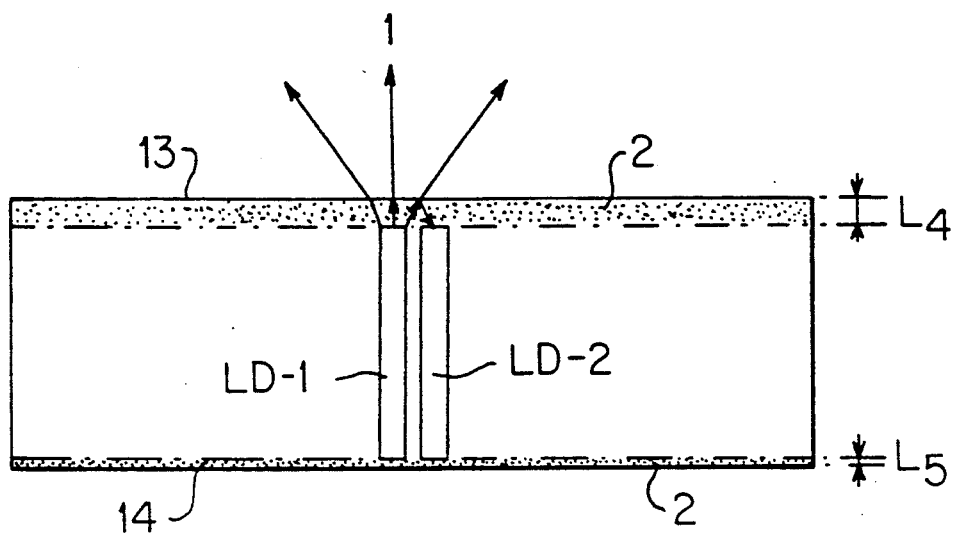
FIG. 7 is a plan view of a modification of the first embodiment of the invention.

Next, description will be given below of a modification of the first embodiment of the invention. In FIG. 7, it is shown this modification which, in addition to the first embodiment, further includes a slight window area 2 on the side of the high reflectance coating 14. If the width L$_5$ of the window area 2 is sufficiently narrow, then the reflection on the high reflectance coating 14 is able to restrict an optical connection between the mutually adjoining semiconductor laser elements. In this case, concretely, L$_4$ is assumed to be 25 μm and L$_5$ is assumed to be 2 μm. Since the width L$_5$ is narrow, the COD level of the end surface is smaller when compared with a case having a sufficiently wide width L$_5$, but it is larger when compared with a case in which no window area is provided.

SECOND EMBODIMENT

Now, description will be given below of a second embodiment of the invention with reference to FIGS. 8 to 11.

Figure 8:
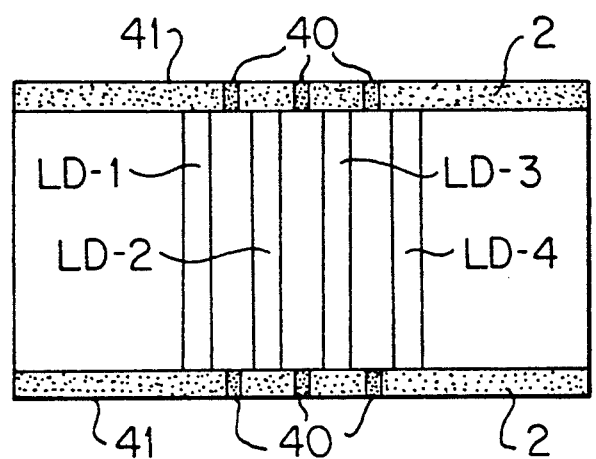
FIG. 8 is a top plan view of a basic structure of a second embodiment of the invention.
Figure 9:
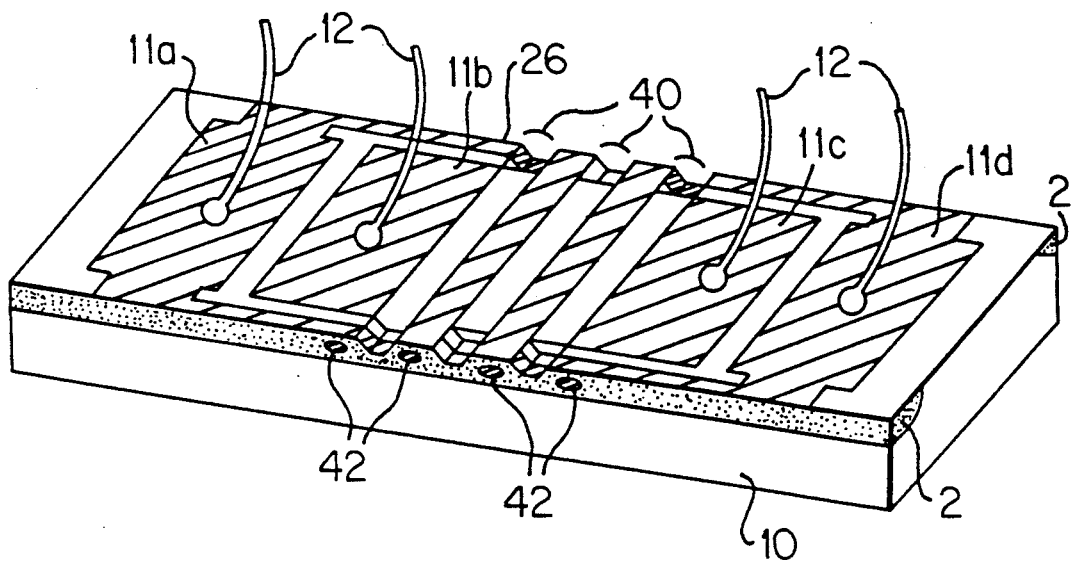
FIG. 9 is a perspective view of a structure of the second embodiment of the invention.

In FIG. 8, it is shown a typical view of the second embodiment of the invention and, in FIG. 9, it is shown a perspective view of a structure of the second embodiment.

According to the second embodiment of the invention, grooves 40 formed by metha-etching are disposed in the window areas 2, whereby light rays respectively emitted from the light emitting spots 42 of the respective semiconductor laser elements can be prevented from entering other semiconductor laser elements than their own semiconductor laser element: That is, the grooves 40 prevent an optical coupling between the mutually adjoining semiconductor laser elements. A process to draw out electrodes from the two central semiconductor laser elements to the bonding pads 11a and 11d is performed by means of wired electrodes 26 which are disposed in the metha-etched area. According to the structure shown in FIG. 8, since the optical coupling can be prevented between the mutually adjoining semiconductor laser elements, it is no need to provide a low reflectance coating, but two high reflectance coatings each having a reflectance of 50%, for example, may be formed respectively on both end surfaces. As discussed before in the description of the prior art, such coating arrangement can reduce the oscillation threshold current, enhance the characteristic temperature, and further improve the thermal cross talk or Droop characteristic. Further, a problem of the COD level reduction resulting from this coating arrangement can be eased by means of employment of a window structure.

Figure 10:
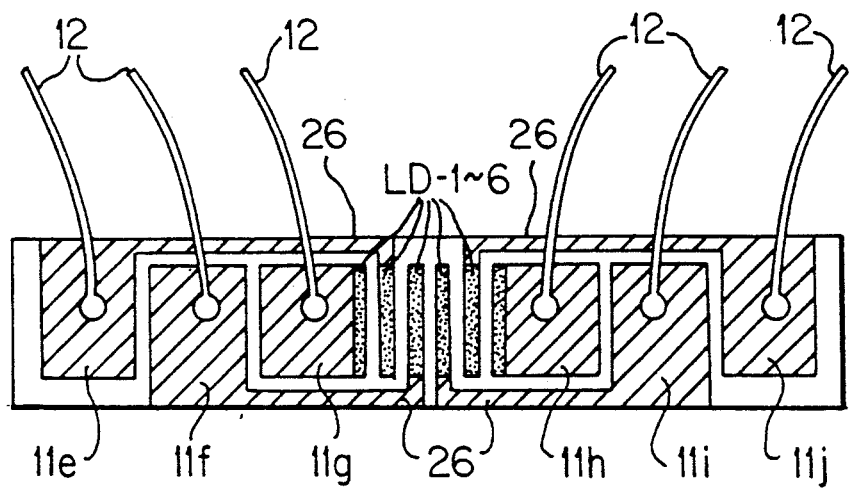
FIG. 10 is a plan view of a case in which a semiconductor laser array having 6 beams is applied to the second embodiment of the invention.

According to the second embodiment of the invention, because the connection electrodes 26 can be respectively disposed on both end surface sides, in the multibeam semiconductor laser array having up to 6 beams, the electrodes can be drawn out without using a multi-layer wiring, as shown in FIG. 10.

The above structure can be made basically in a manufacturing method similar to that discussed in the description of the first embodiment of the invention. That is, an etching process may be inserted between FIGS. 6(c) and 6(d) to thereby form the grooves 40.

In the second embodiment, the grooves are used to prevent the optical connection between the mutually adjoining semiconductor laser elements. However, the invention is not limited to the grooves, but any mechanism can be employed, provided that it is able to prevent the optical connection between the mutually adjoining semiconductor laser elements. For example, there may be reduced the refractive index of the portion of the window area that corresponds to a distance between the mutually adjoining semiconductor laser elements, or an optical absorbing layer may be provided.

Figure 11:
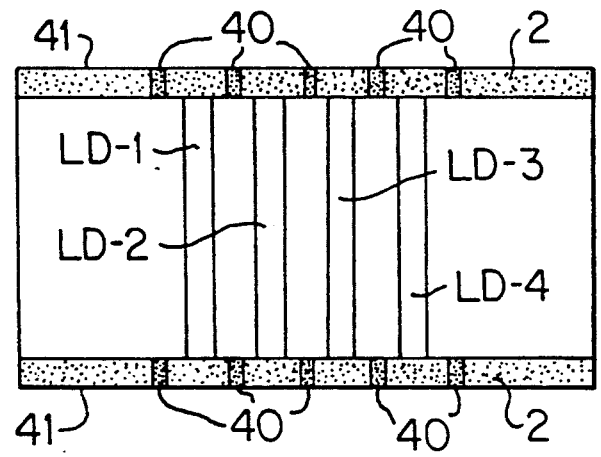
FIG. 11 is a top plan view of a modification of the second embodiment of the invention.

Referring again to the structure shown in FIG. 8, the two outer semiconductor laser elements LD-1 and LD-4 are different from the elements LD-2 and LD-3 interposed between the outer LDs in the optical conditions in the neighborhood of the laser beam emitting portions thereof. Due to this, the characteristics of the emitting laser beams of the elements LD-1 and LD-4 may be different from those of the elements LD-2 and LD-3. In order to prevent generation of such problem, as shown in FIG. 11, optical separation means 40 may be provided outside the two outer semiconductor laser elements (LD-1 and LD-4). The provision of the optical separation means 40 can equalize the optical conditions in the neighborhood of the laser beam leaving portions of all semiconductor laser elements.

THIRD EMBODIMENT

Now, description will be given below of a third embodiment of the invention with reference to FIGS. 12 to 14.

Figure 12:
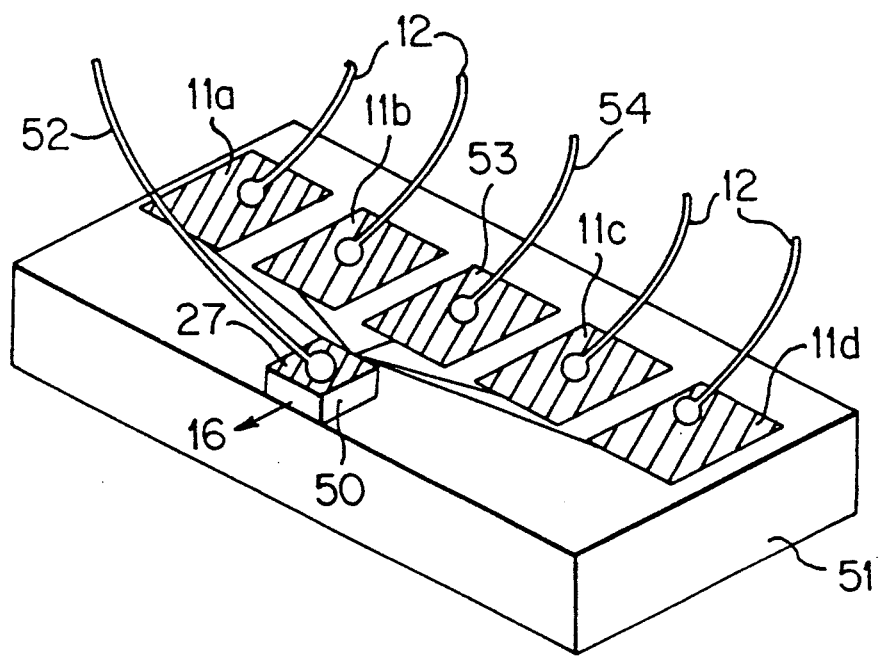
FIG. 12 is a perspective view of a structure of a third embodiment of the invention.
Figure 15:
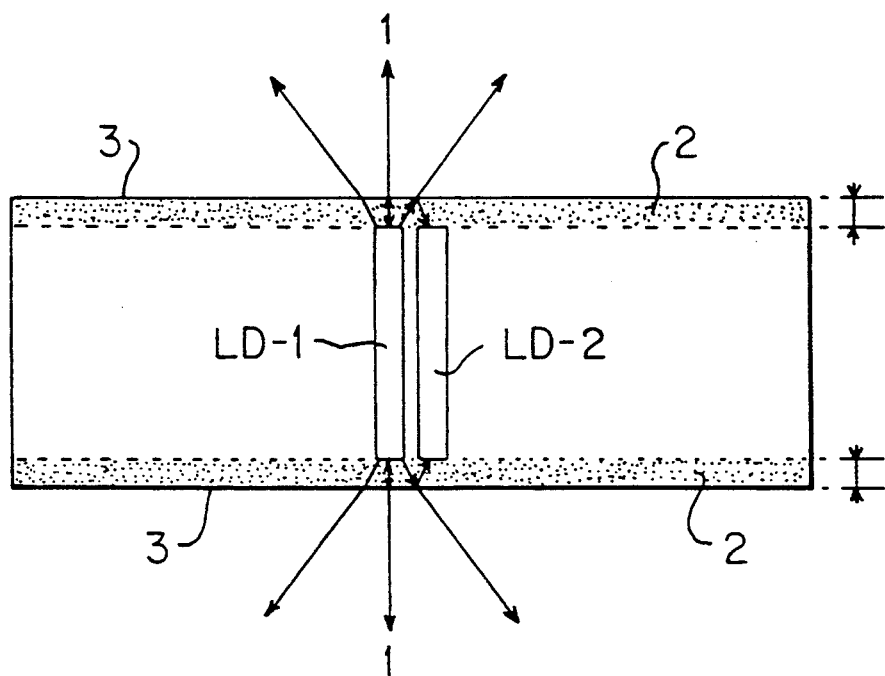
FIG. 15 is a plan view of an example of a light ray emitted from a conventional multibeam semiconductor laser.

In FIG. 12, it is shown the third embodiment of the invention.

According to the third embodiment of the invention, a multibeam semiconductor laser chip 50 is mounted on a heat sink 51 provided with a electrode pattern in a so-called junction-side-down manner.

In FIGS. 13(a) and 13(b), there are shown views of a structure of the multibeam semiconductor laser chip 50. In particular, FIG. 13(a) is a top plan view of the multibeam semiconductor laser chip 50, and FIG. 13(b) is a section view of the chip 50 taken along the line X—X in FIG. 13(a). In this structure, there is provided an insulation layer 45 on a stripe electrode of each of the semiconductor laser elements and further there is disposed a die bond pad 44 on the insulation layer 45. The insulation layer 45 may be preferably formed of an insulator having a good thermal conductivity, for example, AIN, SiNx or the like and the insulation layer 45 has a thickness of the order of 0.2 to 0.5 μm. The insulation layer 45 is formed by means of a combination of spattering and lift-off.

Referring to FIG. 14, it is shown a structure of the heat sink 51 provided with an electrode pattern. In FIG. 14, reference characters 11a to 11d and 53 respectively designate wire bonding pads. Especially, the wire bonding pad 53 is a pad for a grounding electrode. Die bond pads 55a to 55d correspond to the bonding pads 11a to 11d respectively. The wire bonding pads 11a to 11d and 53 are connected with the corresponding die bond pads 55a to 55d an 56 by means of wiring electrodes 57, respectively. Die bond pads 43a to 43d and 44, which are shown in FIGS. 13(a) and 13(b) and included in the multibeam semiconductor laser chip 50, are attached by heating (meltedly attached) to the die bond pads 55a to 55d and 53 of the heat sink 51 shown in FIG. 14.

In the general multibeam semiconductor laser, the stripes are spaced apart from one another by a distance of the order of 10 μm and thus, in the die bonding process, it is very difficult to heat attach (meltedly attach) the respective stripes to the electrodes provided in the heat sink in such a manner that they correspond to one another. However, when the structure according to the present embodiment is employed, then each of the die bond pads may be several hundreds μm square, so that, in the die bonding, the die bond pads can be connected to the respective electrodes in such a manner they correspond to one another.

According to the third embodiment of the invention, the electrodes can be drawn out without using a multi-layer wiring which has several problems. In other words, the multi-layer wiring provides a complicated structure between the semiconductor laser stripes and the heat sink, which worsens the flatness of the die bond pads to thereby increase thermal resistance and reduce yield.

It should be noted here that the third embodiment is especially effective when it is combined with the first or second embodiment of the invention. That is, according to the first or second embodiment of the invention, the multibeam semiconductor laser having up to 4 or 6 beams is able to draw out the electrodes without using the multi-layer wiring.

As has been described heretofore, according to the invention, due to the fact that the first end surface including the window area is made as an optically low reflectance surface, it is possible to decrease the optical cross talk between the mutually adjoining semiconductor laser elements. Further, due to the fact that a coating to increase an optical reflectance is provided on the second end surface disposed opposite to the first end surface and the positive feedback necessary for laser oscillation is executed only by the second end surface covered with the optically high reflectance coating, it is possible to prevent increase in the threshold current of the laser oscillation even if the end surface provided with the window area is made as an optically low reflectance surface.

Also, according to the invention, since the divergence angle $\theta_2$ of a laser beam in a direction perpendicular to the connecting surface can be reduced down to about one-half and also the end surface can be made as a high reflectance surface, it is possible to reduce the threshold current and thermal cross talk and also to prevent the reduction of the maximum output. Further, it is possible to realize a multibeam semiconductor laser array having up to about 6 beams without using a multi-layer wiring and, therefore, it is easy to manufacture the same laser array.

Moreover, by disposing on the window area connecting electrodes for connecting the bonding pads with the individual semiconductor laser elements, a multibeam semiconductor laser array having up to about 6 beams can be realized without using a multi-layer wiring and thus is easy to manufacture.

In addition, according to the invention, due to the fact that a multibeam semiconductor laser chip connected to a heat sink through a connecting portion having a relatively wide area not through a current supply electrode having a slight clearance, the multibeam semiconductor laser chip can be mounted on the heat sink in a junction-side-down manner. For this reason, the thermal cross talk can be improved and at the same time the maximum output can be enhanced.

What is claimed is:

1. A multibeam semiconductor laser array comprising:
   a substrate;
   a plurality of semiconductor laser elements respectively provided on said substrate, each of said semiconductor laser elements being coupled to one of a plurality of electrodes and being drivable independently of one another;
   a first window area disposed on a first end surface of a cavity forming said semiconductor laser elements, said first window area having a band gap wider than that of an active material layer of each of said semiconductor laser elements, and not excitable electrically;
   a low reflectance coating applied to said first window area for reducing an optical reflectance; and
   a high reflectance coating disposed on a second end surface of said cavity forming said semiconductor laser elements for increasing the optical reflectance.

2. The multibeam semiconductor laser array as recited in claim 1, further comprising bonding pads disposed on a surface intersecting said cavity at right angles, each of said electrodes connecting one of said respective bonding pads with a respective one of said semiconductor laser elements, said electrodes being disposed in said first window area on a side of the first end surface intersecting said cavity at right angles.

3. The multibeam semiconductor laser array as recited in claim 1, wherein each of said electrodes comprises a current supply electrode disposed on a surface intersecting said cavity at right angles for supplying a current to a respective one of said semiconductor laser elements, wherein an insulation layer is disposed on said current supply electrode, and wherein a heat sink is disposed on said insulation layer.

4. The multibeam semiconductor laser array as recited in claim 1, further comprising a second window area interposed between said second end surface and said high reflectance coating, said second window area having a band gap wider than the active material layer of said semiconductor laser element, being electrically unexcitable, and having a width narrower than that of said first window area.

5. The multibeam semiconductor laser array recited in claim 4, wherein each of said electrodes comprises a current supply electrode disposed on a surface intersecting said cavity at right angles for supplying a current into a respective one of said semiconductor laser elements, wherein an insulation layer is disposed on said current supply electrode, and wherein a heat sink is disposed on said insulation layer.

6. The multibeam semiconductor laser array as recited in claim 4, further comprising a plurality of bonding pads disposed on a surface intersecting said cavity at right angles, each of said electrodes connecting one of said respective bonding pads with a respective one of said semiconductor laser elements, said electrodes being disposed in said first window area located on a side of the first end surface intersecting said cavity at right angles.

7. A multibeam semiconductor laser array comprising:
   a substrate;
   a plurality of semiconductor laser elements respectively disposed on said substrate, each of said semiconductor laser elements being coupled to one of a plurality of electrodes and being drivable independently of one another; and
   window areas respectively disposed in first and second end surfaces of a cavity forming said semiconductor laser elements, each of said window areas having a band gap wider than an active material layer of each of said semiconductor laser elements, being not excitable electrically and including separation means for optically separating the mutually adjoining semiconductor laser elements.

8. The multibeam semiconductor laser array as recited in claim 7, further comprising a plurality of bonding pads disposed on a surface intersecting said cavity at right angles, each of said electrodes connecting one of said respective bonding pads with a respective one of said semiconductor laser elements, said electrodes being disposed in said window area in said first end surface, said electrodes being located on a side of the first end surface intersecting said cavity at right angles.

9. The multibeam semiconductor laser array as recited in claim 7, wherein each of said electrodes comprises a current supply electrode disposed on a surface intersecting said cavity at right angles for supplying a current into a respective one of said semiconductor laser elements, wherein an insulation layer is disposed on said current supply electrode, and wherein a heat sink is disposed on said insulation layer.

10. A multibeam semiconductor laser array comprising:
    a substrate;
    a plurality of semiconductor laser elements respectively disposed on said substrate and drivable independently of one another;
    a plurality of current supply electrodes disposed on a surface intersecting a cavity forming said semiconductor laser elements at right angles, each of said current supply electrodes supplying a current into a respective one of said semiconductor laser elements;
    an insulation layer disposed on said current supply electrodes; and
    a heat sink disposed on said insulation layer.

* * * * *